(12) United States Patent
Kim et al.

(10) Patent No.: US 7,592,708 B2
(45) Date of Patent: Sep. 22, 2009

(54) PACKAGE BOARD, SEMICONDUCTOR PACKAGE, AND FABRICATING METHOD THEREOF

(75) Inventors: Seung-Gu Kim, Chungcheonbuk-do (KR); Je-Gwang Yoo, Yongin-si (KR); Yong-Bin Lee, Cheongju-si (KR); Yoo-Keum Wee, Goyang-si (KR); Seok-Hwan Huh, Seoul (KR); Chang-Sup Ryu, Yongin-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 337 days.

(21) Appl. No.: 11/528,324

(22) Filed: Sep. 28, 2006

(65) Prior Publication Data

US 2007/0080469 A1 Apr. 12, 2007

(30) Foreign Application Priority Data

Oct. 7, 2005 (KR) ...................... 10-2005-0094546

(51) Int. Cl.
*H01L 21/31* (2006.01)
*H01L 21/469* (2006.01)
(52) U.S. Cl. ...................... 257/783; 257/787; 438/118
(58) Field of Classification Search .................. 257/701, 257/782, 783, 784, 787; 438/118, 125, 127
See application file for complete search history.

(56) References Cited

U.S. PATENT DOCUMENTS

| 2002/0119595 | A1* | 8/2002 | Kim et al. ..................... 438/106 |
| 2002/0171145 | A1* | 11/2002 | Higuchi et al. .............. 257/738 |
| 2008/0054434 | A1* | 3/2008 | Kim ........................... 257/686 |
| 2008/0067699 | A1* | 3/2008 | Tamaki ....................... 257/787 |

FOREIGN PATENT DOCUMENTS

JP 8-316360 11/1996
JP 411150206 A * 6/1999

OTHER PUBLICATIONS

Notice of Preliminary Rejection, dated Sep. 26, 2006 (KIPO) Korean Intellectual Property Office.

* cited by examiner

*Primary Examiner*—S. V Clark

(57) ABSTRACT

With a semiconductor package according to an aspect of the present invention comprising a board having circuit lines, solder resist formed on a surface of the board, and a chip mounted on the board and having at least one bump attached to at least a portion of the circuit lines, where the solder resist comprises a perimeter groove, which exposes at least a portion of the circuit lines, and an extension groove, which is connected to the perimeter groove, and where encapsulant is filled in the perimeter groove and the extension groove, the filling characteristics of the encapsulant is improved for greater reliability in the electrical connections between the chip and the board.

22 Claims, 5 Drawing Sheets injection direction injection direction injection direction injection direction

PACKAGE BOARD, SEMICONDUCTOR PACKAGE, AND FABRICATING METHOD THEREOF

CROSS-REFERENCE TO RELATED APPLICATIONS

This application claims the benefit of Korean Patent Application No. 2005-0094546 filed with the Korean Intellectual Property Office on Oct. 7, 2005, the disclosure of which is incorporated herein by reference in its entirety.

BACKGROUND

1. Technical Field

The present invention relates to a package board, semiconductor package, and fabricating method thereof.

2. Description of the Related Art

Generally, a semiconductor chip is mounted on a printed circuit board to form a package. In a chip scale package (CSP), wafer level package (WLP), direct chip attachment (DCA) package, ball grid array (BGA) package, flip chip package, and through-hole package, the bumps of a semiconductor chip is electrically joined with the circuits of the board. Typically, the semiconductor chip is positioned with respect to the board such that the bumps and circuits are in alignment, which are attached by a technique of reflowing solder formed between the board and the semiconductor chip. In a flip chip package and a chip scale package, there is a space or gap between the chip and the board.

The semiconductor chip and the board are generally formed from different materials having different coefficients of thermal expansion. Therefore, due to the heat applied during the process of fabricating a semiconductor package, a substantial amount of deformation occurs in the electrical connections between the board and the semiconductor chip. Such an imbalance in thermal expansion degrades the performance of the semiconductor chip and weakens the connections between the chip and the board, to incur malfunctioning of the entire package. This phenomenon is more significant when the size of the semiconductor chip is increased.

To resolve such problems and improve reliability in the electrical connections of the board and the semiconductor chip, an underfill method is being used of filling the gap between the board and the chip with encapsulant. This method of fabricating a semiconductor package isolates the electrical connections from exposure to the ambient environment, and provides mechanical strength to the semiconductor package and allows it to resist dynamic and static mechanical loads. Also, the encapsulant removes heat from the semiconductor chip, and provides additional thermal conduction paths which reduce the temperature difference between the semiconductor chip and the board. As a result, the underfill process for a semiconductor package using encapsulant significantly increases the life span of the semiconductor package.

SUMMARY

The present invention aims to provide a package board, semiconductor package, and fabricating method thereof, in which the filling characteristics of encapsulant is improved for greater reliability in the electrical connections between the chip and the board.

One aspect of the present invention provides a semiconductor package comprising a board having circuit lines, solder resist formed on a surface of the board, and a chip mounted on the board and having at least one bump attached to at least a portion of the circuit lines, where the solder resist comprises a perimeter groove, which exposes at least a portion of the circuit lines, and an extension groove, which is connected to the perimeter groove, and where encapsulant is filled in the perimeter groove and the extension groove.

The extension groove may have a predetermined injection angle with respect to an injection direction of the encapsulant.

The solder resist may include an inner portion and an outer portion divided by the perimeter groove, while the extension groove may be formed in the inner portion or in the outer portion.

When the extension groove exposes portions of the circuit lines where soldering is not required, the extension groove may be composed of a first extension groove, formed in-between portions of the circuit lines, and a second extension groove, formed over the first extension groove and with a portion thereof positioned over at least a portion of the circuit lines.

At least a portion of the circuit lines and the at least one bump may be attached by means of solder. Also, the encapsulant may be an epoxy resin.

Another aspect of the invention provides a method of fabricating a semiconductor package, comprising: forming solder resist on a surface of a board, on which circuit lines are formed; forming a perimeter groove, which exposes at least a portion of the circuit lines, and an extension groove, which is connected to the perimeter groove; mounting a chip on the board, where the chip has at least one bump joined to at least a portion of the circuit lines; and injecting encapsulant to fill the perimeter groove and the at least one extension groove.

The perimeter groove and the at least one extension groove may be formed by exposing and developing the solder resist.

The at least one extension groove may be formed at a side of at least one of the circuit lines with a predetermined injection angle with respect to an injection direction of the encapsulant.

At least a portion of the circuit lines and the at least one bump may be joined by means of solder. The solder resist may comprise an inner portion and an outer portion divided by the perimeter groove, and the at least one extension groove may be formed in the inner portion or in the outer portion. The encapsulant may be an epoxy resin.

When portions of the circuit lines which do not require soldering are exposed by the at least one extension groove, the forming of the extension groove may further comprise forming a first extension groove in-between portions of the circuit lines, and forming a second extension groove, which has a portion positioned over at least a portion of the circuit lines, over the first extension groove.

Yet another aspect of the invention provides a package board comprising a board having circuit lines, and solder resist formed on a surface of the board, where the solder resist comprises a perimeter groove, which exposes at least a portion of the circuit lines, and an extension groove, which is connected to the perimeter groove, and where encapsulant is filled in the perimeter groove and the extension groove.

The extension groove may have a predetermined injection angle with respect to an injection direction of the encapsulant.

The solder resist may comprise an inner portion and an outer portion divided by the perimeter groove, with the extension groove formed in the inner portion. Also, the solder resist may comprise an inner portion and an outer portion divided by the perimeter groove, with the extension groove formed in the outer portion.

The extension groove may be composed of a first extension groove, formed in-between portions of the circuit lines, and a second extension groove, formed over the first extension groove and with a portion thereof positioned over at least a portion of the circuit lines.

At least a portion of the circuit lines may be attached to at least one bump of a chip by means of solder, and the encapsulant may be an epoxy resin.

Additional aspects and advantages of the present invention will be set forth in part in the description which follows, and in part will be obvious from the description, or may be learned by practice of the invention.

DETAILED DESCRIPTION

Embodiments of a package board, semiconductor package, and fabricating method thereof, according to the present invention will be described below in more detail with reference to the accompanying drawings. In the description with reference to the accompanying drawings, those components are rendered the same reference number that are the same or are in correspondence regardless of the figure number, and redundant explanations are omitted.

Figure 1:
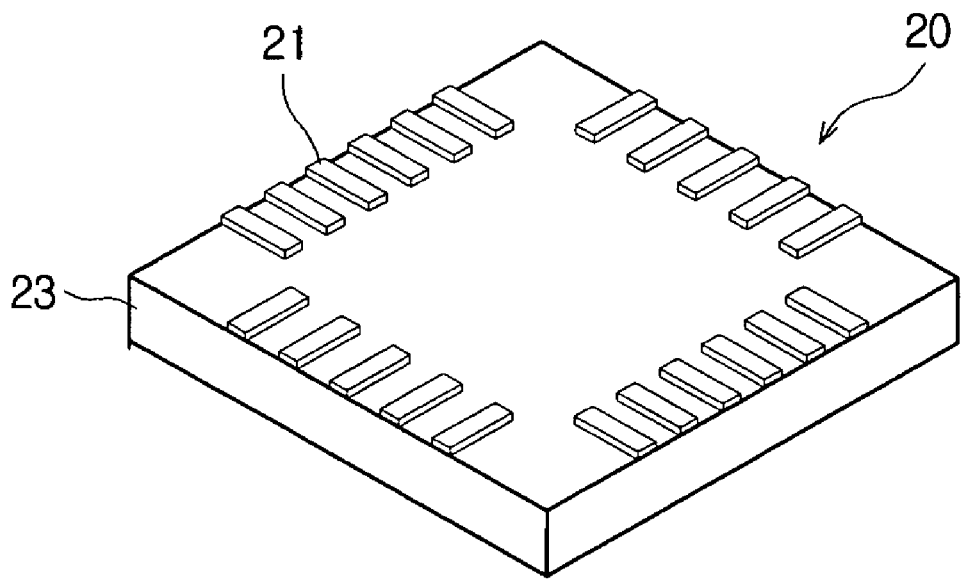
FIG. 1 is a perspective view of a board on which several circuit lines are formed.

FIG. 1 is a perspective view of a board 20 on which several circuit lines 21 are formed.

On the board 20, several circuit lines 21 that connect with the bumps of a chip are formed on an insulation layer 23. The circuit lines 21 may be formed by methods such as etching a surface of a typical copper clad laminate (CCL). While the circuit lines 21 are shown, for convenience in description, to be arranged in constant intervals along the perimeter of the board 20, the arrangement of the circuit lines is not thus limited. The circuit lines 21 may also be formed on the other surface of the board 20.

The insulation layer 23 insulates the circuit lines 21 formed on the upper surface and the lower surface of the board 20, where several plated through-holes or via holes may be formed for connecting certain circuits 21 formed on the upper and the lower surfaces. The board 20 may not only be a printed circuit board, such as that illustrated in FIG. 1, but also may be of an organic or ceramic material, such as for a flip chip module or a flip chip carrier.

Figure 2:
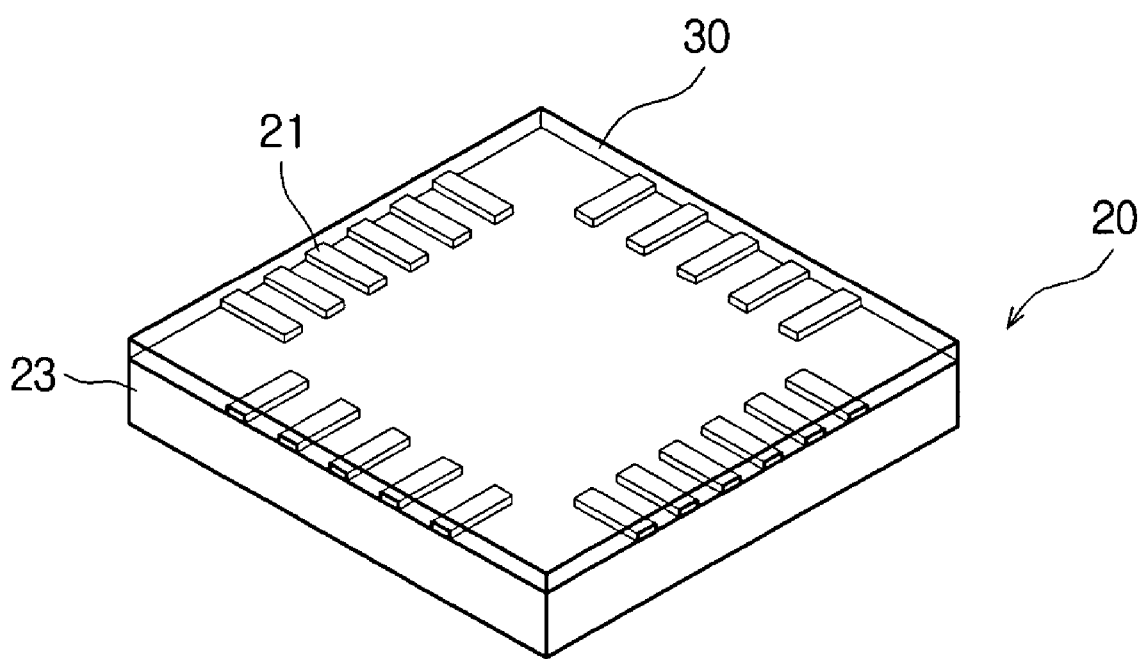
FIG. 2 is a perspective view illustrating solder resist formed on the board, in a method of fabricating a semiconductor package according to an embodiment of the present invention.

FIG. 2 is a perspective view illustrating solder resist 30 formed in a predetermined thickness on the board 20 of FIG. 1.

The solder resist 30 is a polymer, in which a curing agent, etc., is added to a photosensitive resin that can be cured by heat or ultra-violet rays. The solder resist 30 protects the circuit lines 21 formed on the surface of the board 20, prevents the oxidation of the board's surface, and maintains electrical insulation stability between the circuit lines 21. Also, when mounting a chip on the board 20, it prevents the attaching of solder in portions other than the portion where the chip is to be mounted, and prevents short-circuiting between the circuit lines when the chip is mounted.

For the application of the solder resist 30 on the board 20, the board 20 is pretreated, after which the solder resist 30 is coated and preliminarily dried.

The pretreating of the board 20 refers to a process for removing foreign substances, copper oxide layers, and oil components from the board 20 and for increasing the adhesion to the solder resist. Methods of pretreatment include physical methods such as buff polishing and jet polishing, etc., and chemical methods such as soft etching and MEC treatment. As such pretreating of the solder board and the coating and preliminary drying of the solder resist 30 are of common art, detailed descriptions relating to these matters will not be provided.

Figure 3:
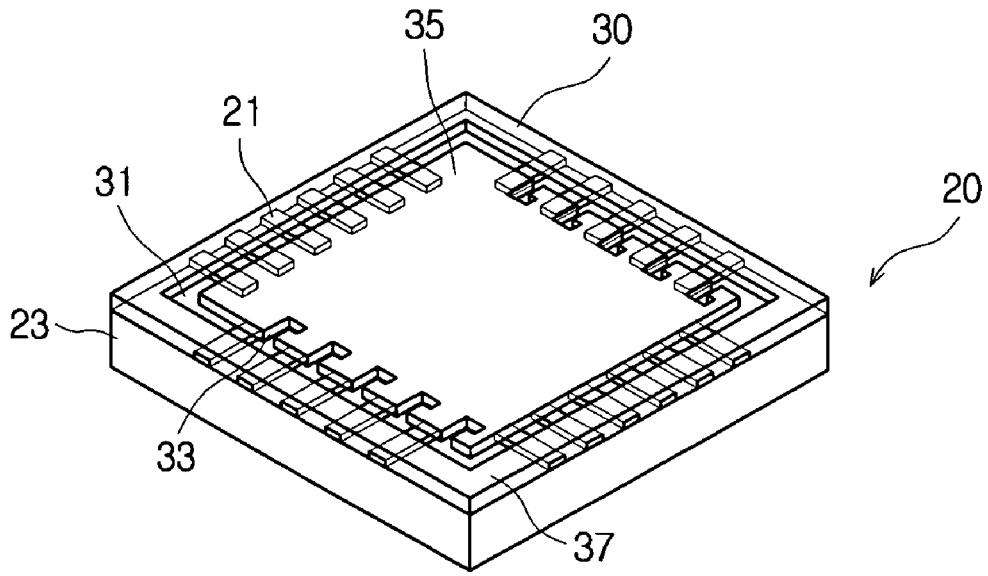
FIG. 3 is a perspective view illustrating a perimeter groove and extension grooves formed in the solder resist, in a method of fabricating a semiconductor package according to an embodiment of the present invention.
Figure 4:
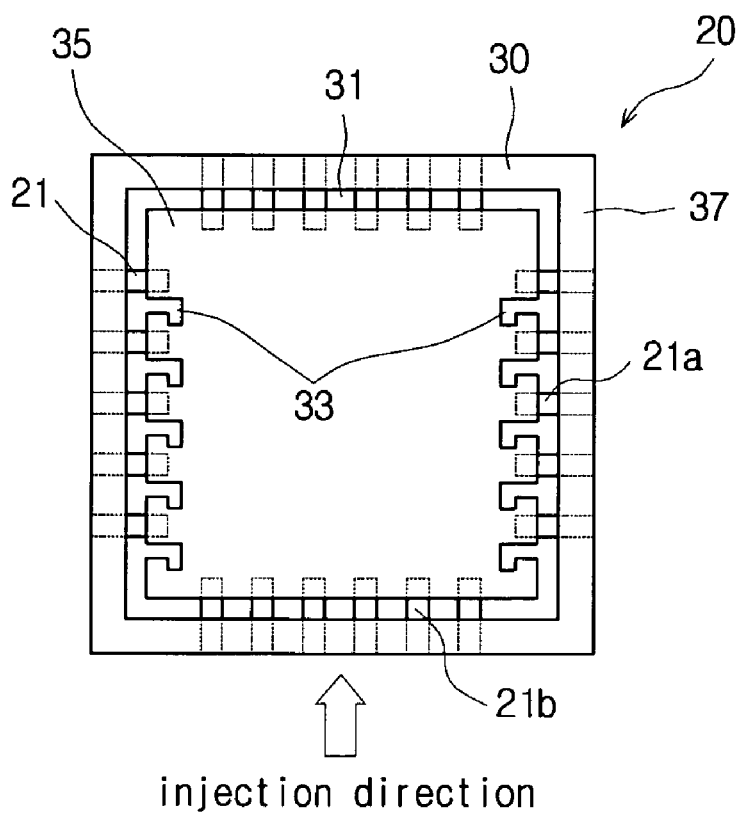
FIG. 4 is a plan view illustrating the perimeter groove and extension grooves formed in the solder resist as in FIG. 3, in a method of fabricating a semiconductor package according to an embodiment of the present invention.

FIG. 3 is a perspective view illustrating a perimeter groove 31 and extension grooves 33 formed in the solder resist 30, in a method of fabricating a semiconductor package according to an embodiment of the present invention, and FIG. 4 is a corresponding plan view.

As illustrated in FIG. 3, in the solder resist 30 are formed a perimeter groove 31, which exposes the circuit lines 21 formed on the board 20 to the exterior, and extension grooves 33, which are connected to the perimeter groove 31. Also, the solder resist 30 has an inner portion 35 and an outer portion 37 divided by the perimeter groove 31. Portions of the circuit lines 21 formed on the board 20 are exposed at the perimeter groove 31.

The perimeter groove 31 may be formed in a quadrilateral shape in a surface of the solder resist 30, in correspondence with the shape of the chip mounted on the board 20. Encapsulant will subsequently be filled in the perimeter groove 31 by an underfill process. At one side of the perimeter groove 31, a needle (not shown), etc., is inserted for injecting the encapsulant, and as illustrated in FIG. 4, the encapsulant is filled to a relatively lesser extent around the circuit lines 21a formed perpendicularly to the injection direction (the direction of the arrow) of the encapsulant compared with the circuit lines 21b formed in the same direction as the injection direction. Therefore, in embodiments of the present invention, the solder resist 30 has extension grooves 33 connected to the perimeter groove 31 for increasing the degree to which the encapsulant is filled. Of course, while the extension grooves 33 may be positioned perpendicularly to the injection direction of the encapsulant, they may also be given a predetermined slope (a).

The extension grooves 33 are positioned, in the inner portion 35 of the solder resist 30, adjacent the circuit lines 21a that are perpendicular to the injection direction of the encapsulant. A chip will later be mounted in the inner portion 35. The extension grooves 33 may be formed not only in the inner portion 35 of the solder resist but also in the outer portion 37. The extension grooves 33 are connected with the perimeter groove 31, and thus the encapsulant injected into the perimeter groove 31 flows into the extension grooves 33, to improve the filling of the encapsulant around circuit lines 21a positioned perpendicularly to the injection direction. In other words, the extension grooves 33 improve the flow of the encapsulant to improve the filling of the encapsulant.

The extension grooves 33 may have any of a variety of shapes, besides the ""ᵰ"" shape illustrated in FIGS. 3 and 4. For instance, the extension grooves may be formed having a predetermined angle with respect to the injection direction of the encapsulant, or may be formed as curves.

The perimeter groove 31 and extension grooves 33 may be formed via the exposure and development of the solder resist 30. The exposure refers to a process of aligning a board 20 coated with solder resist 30 and a work film having preconfigured images and then applying ultra-violet rays for photocuring only the necessary portions. The development is a process of using developing liquid to remove portions of the solder resist 30 that were not exposed to the ultra-violet rays in the exposure process. A sodium carbonate ($Na_2CO_3$) solution may be used for the developing liquid.

After the exposure and development processes, an additional UV curing process may be performed, in which a polymerization reaction is started for unreacted photo-initiators and mono-polymers to result in a complete photoreaction. Also, a final post-curing process may be performed after the UV curing process for completely curing the solder resist 30. In the final post-curing process, the solder resist is heated at a temperature of 150° C. for about 30 to 60 minutes.

Figure 5A:
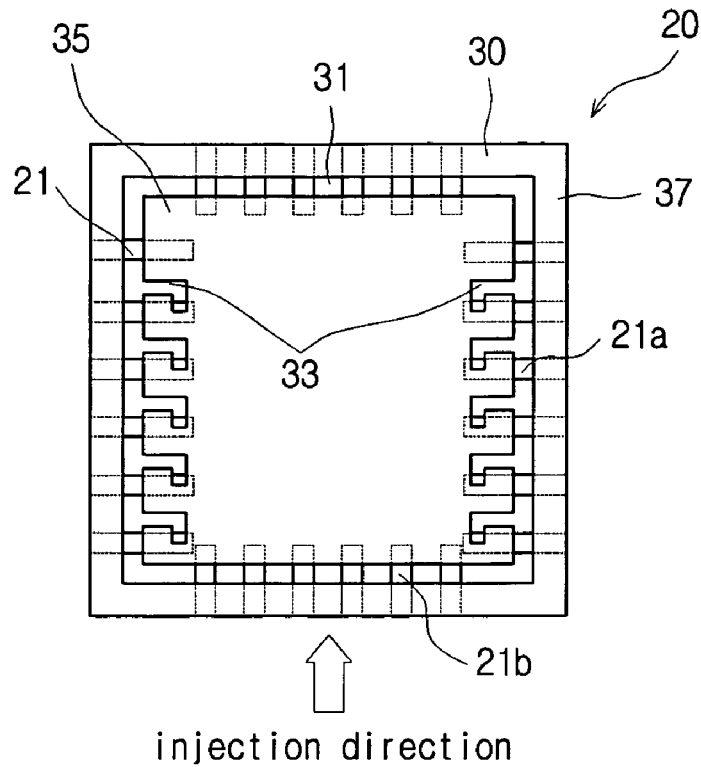
FIG. 5a is a plan view illustrating portions of the circuit lines exposed by the forming of the extension grooves, in a method of fabricating a semiconductor package according to an embodiment of the present invention.
Figure 5B:
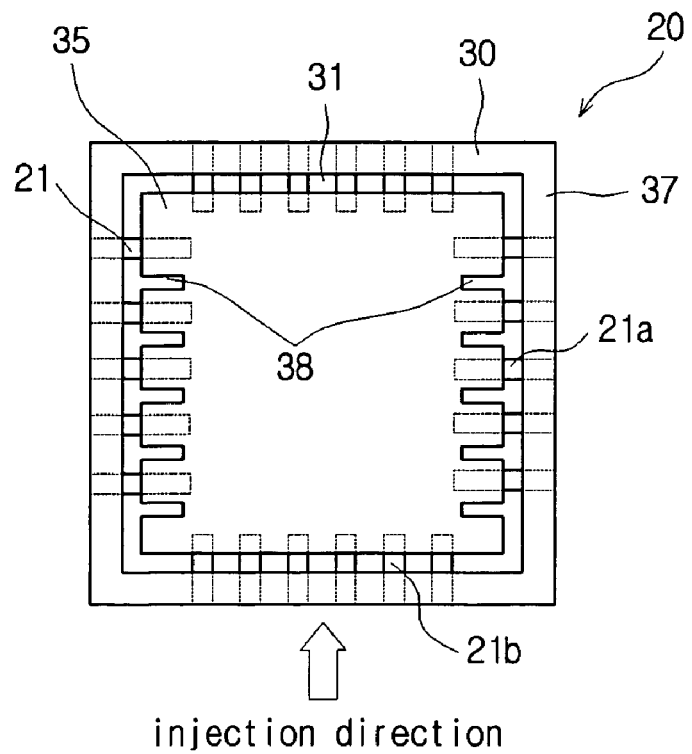
FIG. 5b is a plan view illustrating first extension grooves formed such that the circuit lines are not exposed.
Figure 5C:
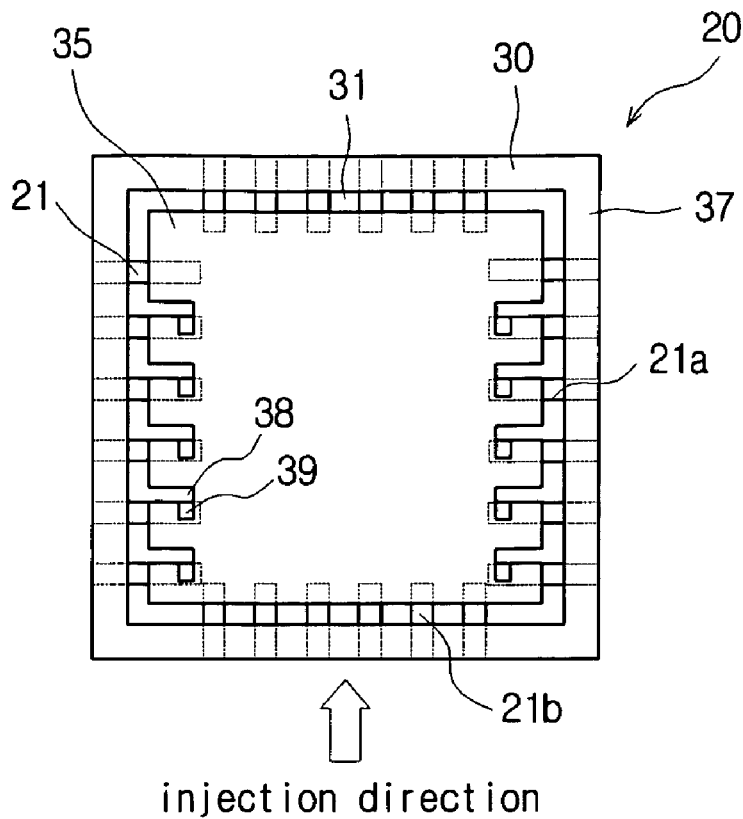
FIG. 5c is a plan view illustrating second extension grooves formed over the first extension grooves.

FIG. 5a is a plan view illustrating portions of the circuit lines 21 exposed by the forming of the extension grooves 33, in a method of fabricating a semiconductor package according to an embodiment of the present invention, FIG. 5b is a plan view illustrating first extension grooves formed such that the circuit lines 21a are not exposed, and FIG. 5c is a plan view illustrating second extension grooves formed over the first extension grooves.

During the forming of the extension grooves 33, portions of the circuit lines in the inner portion 35 of the solder resist 30 may be exposed, as illustrated in FIG. 5a, which may cause a malfunctioning of the entire package when, during the soldering process, portions are soldered where soldering is not required. This may occur when the extension grooves 33 are formed long or when the circuit lines 21a are complicated.

In order to prevent the circuit lines from being exposed thus, when the extension grooves extend to portions where soldering is not required, first extension grooves 38 are formed in-between the circuit lines 21a, as illustrated in FIG. 5b, in the process of applying the solder resist 30 and forming the perimeter groove 31. The first extension grooves 38 are grooves defined by the solder resist which covers the circuit lines 21a, and while they are formed adjacent the circuit lines 21a, they are arranged not to expose the circuit lines 21a. In subsequent procedures, the first extension grooves 38 are overlapped with portions of second extension grooves 39 and are filled with the encapsulant by an underfill process.

Then, to improve the filling of the encapsulant, second extension grooves 39, which may have the same shape as that of the extension grooves 33 illustrated in FIG. 4, are formed over the first extension grooves 38. Portions of the second extension grooves 39 may be positioned over the circuit lines 21a, where the circuit lines 21a are covered by the solder resist 30 and thus are not exposed to the exterior. The second extension grooves 39 may have portions overlapping the first extension grooves 38, and may have a ""ᵰ"" shape. The second extension grooves 39, together with the first extension grooves 38, are filled with encapsulant by an underfill process, and allow better filling of the encapsulant. The method of forming the second extension grooves 39 may be identical to that for the first extension grooves 38. That is, after coating solder resist on a board having the first extension grooves 38 formed thereon, portions of the solder resist corresponding to the shapes of the second extension groove 39 may be removed by a chemical method, etc.

The operation of mounting a chip on the board 20 will be described with reference to FIGS. 6 and 7.

Figure 6:
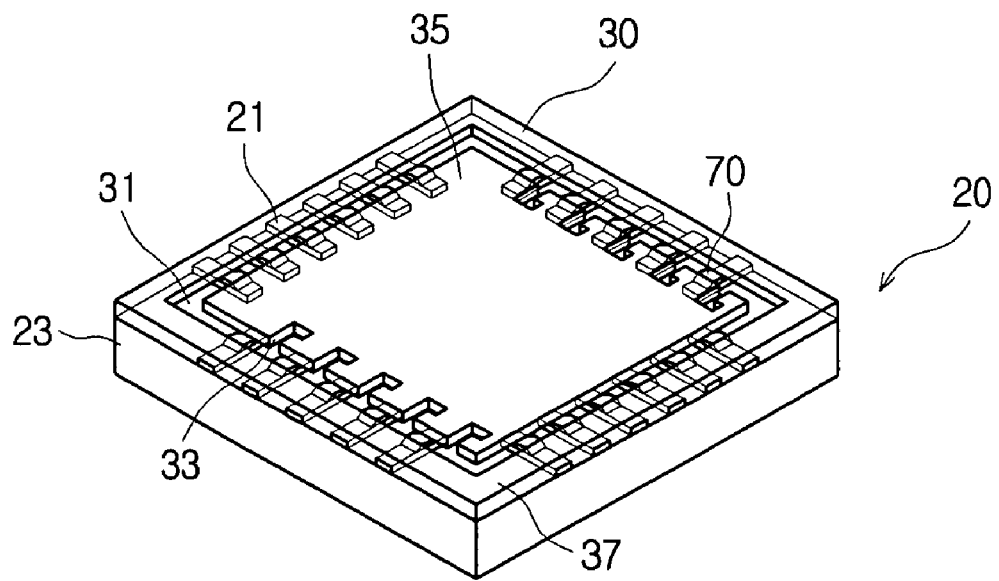
FIG. 6 is a perspective view illustrating solder coated on the circuit lines exposed by the perimeter groove, in a method of fabricating a semiconductor package according to an embodiment of the present invention.
Figure 7:
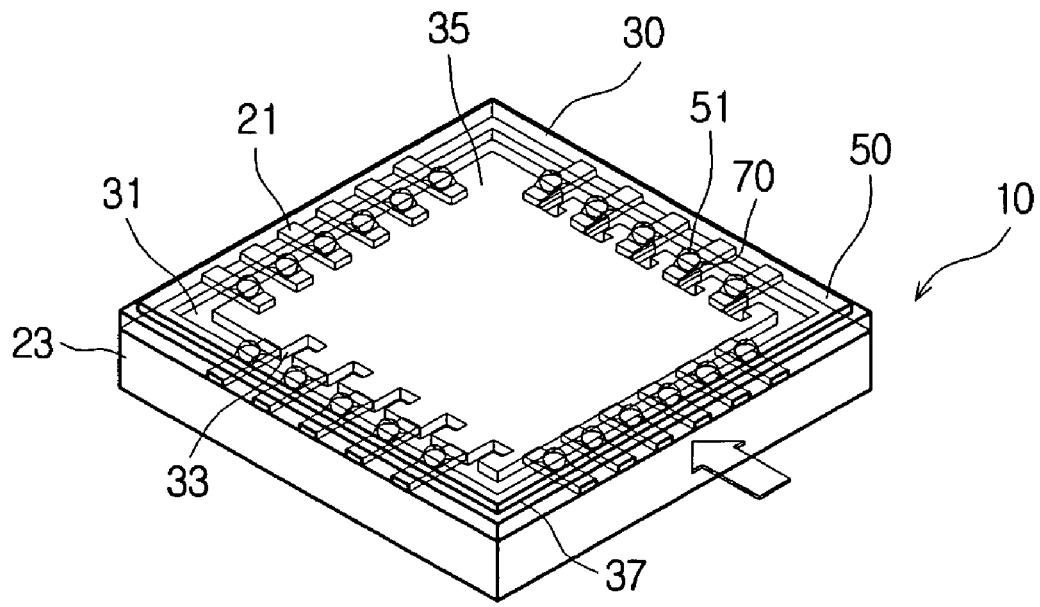
FIG. 7 is a perspective view illustrating a chip mounted on the board, in a method of fabricating a semiconductor package according to an embodiment of the present invention.

FIG. 6 is a perspective view illustrating solder coated on the circuit lines exposed by the perimeter groove, in a method of fabricating a semiconductor package according to an embodiment of the present invention, and FIG. 7 is a perspective view illustrating a chip mounted on the board, in a method of fabricating a semiconductor package according to an embodiment of the present invention.

The chip may have an appropriate, predetermined form, and is not limited to the quadrilateral form illustrated in FIGS. 6 and 7. On the other surface of the chip 50 are formed bumps 51, which are for electrically and mechanically joining the chip and the board. The positions and number of the bumps 51 are in correspondence with the circuit lines 21 exposed by the perimeter groove 31.

As illustrated in FIG. 6, solder 70 is coated on the circuit lines 21 exposed by the perimeter groove 31. Examples of coating methods include applying solder ink using a metal mask and printing using an inkjet printer. Then, the bumps 51 of the chip 50 are positioned on the circuit lines 21, after which a reflow process is performed to fuse the solder positioned on the circuit lines 21. A reflow process refers to a process of heating a board having a chip and/or other components mounted thereon to a certain temperature and fusing the solder 70. The reflow temperature may vary according to the type of solder used. Also, the reflow time may vary according to the size of the board and the number or type of the chips.

Such a reflow process joins the circuit lines 21 and the bumps 51 electrically and mechanically, and the chip 50 is thus mounted on the board 20, as illustrated in FIG. 7. Afterwards, an underfill process is performed using an underfill dispenser (not shown), to fill the perimeter groove 31 and extension grooves 33 with encapsulant.

An underfill dispenser may be of any form publicly known in the relevant field of art for dispensing liquid encapsulant or underfill material. An example of a pump suitable for an underfill dispenser for dispensing encapsulant includes the DP-3000 pump from Nordson Asymtek (Carlsbad, Calif.). The underfill dispenser and pump may be implemented as an automated system, such as the M-1020, X-1020, M-620, or C-720 underfill dispensing system from Nordson Asymtek (Carlsbad, Calif.).

The encapsulant filled by the underfill process in the perimeter groove 31 and extension grooves 33 may be a typical epoxy resin. The encapsulant isolates the connections between the circuit lines 21 and the bumps 51 from exposure to the exterior, and provides mechanical strength to the semiconductor package for resisting static and dynamic loads. Also, the encapsulant removes heat from the semiconductor chip and provides thermal conduction paths which reduce the temperature difference between the semiconductor chip and the board.

As extension grooves 33 are formed around circuit lines 21a positioned perpendicularly to the injection direction of the encapsulant, a smoother flow is allowed of the encapsulant. Thus, the filling of encapsulant is improved not only around the circuit lines 21b positioned in the same direction as the injection direction but also around the circuit lines 21a positioned perpendicularly, whereby stable electrical connections are obtained between the board and the chip.

Figure 8:
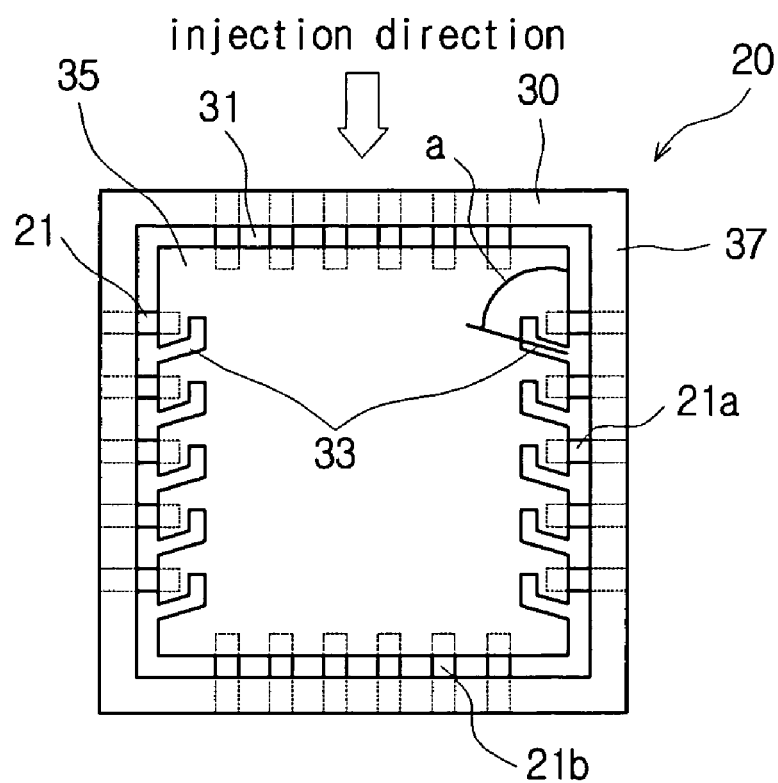
FIG. 8 is a plan view illustrating extension grooves formed to have a predetermined injection angle with respect to the injection direction, in a method of fabricating a semiconductor package according to another embodiment of the present invention.

FIG. 8 is a plan view illustrating extension grooves 33 formed to have a predetermined injection angle with respect to the injection direction, in a method of fabricating a semiconductor package according to another embodiment of the present invention.

As illustrated in FIG. 8, the extension grooves 33 may have a predetermined injection angle (a) with respect to the injection direction (the direction of the arrow) of the encapsulant. The value of the injection angle may be between 0° to 180°. Providing the extension grooves 33 with an injection angle further facilitates the inflow of the encapsulant into the extension grooves 33, by which the filling of the encapsulant is improved around circuit lines 21a that are perpendicular to the injection direction.

According to the present invention set forth above, a package board, semiconductor package, and fabricating method thereof are provided, in which the filling characteristics of encapsulant can be improved for greater reliability in the electrical connections between the chip and the board.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A semiconductor package comprising:
   a board having circuit lines;
   solder resist formed on a surface of the board; and
   a chip mounted on the board and having at least one bump attached to at least a portion of the circuit lines,
   wherein the solder resist comprises a perimeter groove and an extension groove, the perimeter groove exposing at least a portion of the circuit lines, and the extension groove connected to the perimeter groove,
   and wherein encapsulant is filled in the perimeter groove and the extension groove.

2. The semiconductor package of claim 1, wherein the extension groove has a predetermined injection angle with respect to an injection direction of the encapsulant.

3. The semiconductor package of claim 1, wherein the solder resist comprises an inner portion and an outer portion divided by the perimeter groove, and the extension groove is formed in the inner portion.

4. The semiconductor package of claim 1, wherein the solder resist comprises an inner portion and an outer portion divided by the perimeter groove, and the extension groove is formed in the outer portion.

5. The semiconductor package of claim 1, wherein the extension groove comprises a first extension groove and a second extension groove, the first extension groove formed in-between portions of the circuit lines, and the second extension groove formed over the first extension groove and having a portion thereof positioned over at least a portion of the circuit lines.

6. The semiconductor package of claim 1, wherein at least a portion of the circuit lines and the at least one bump are attached by means of solder.

7. The semiconductor package of claim 1, wherein the encapsulant is an epoxy resin.

8. A method of fabricating a semiconductor package, the method comprising:
   (a) forming solder resist on a surface of a board having circuit lines formed thereon;
   (b) forming a perimeter groove and at least one extension groove on the solder, wherein the perimeter groove exposes at least a portion of the circuit lines, and the at least one extension groove is connected to the perimeter groove;
   (c) mounting a chip on the board, wherein the chip has at least one bump joined to at least a portion of the circuit lines; and
   (d) injecting encapsulant to fill the perimeter groove and the at least one extension groove.

9. The method of claim 8, wherein the perimeter groove and the at least one extension groove are formed by exposing and developing the solder resist.

10. The method of claim 8, wherein the at least one extension groove is formed at a side of at least one of the circuit lines with a predetermined injection angle with respect to an injection direction of the encapsulant.

11. The method of claim 8, wherein at least a portion of the circuit lines and the at least one bump are joined by means of solder.

12. The method of claim 8, wherein the solder resist comprises an inner portion and an outer portion divided by the perimeter groove, and the at least one extension groove is formed in the inner portion.

13. The method of claim 8, wherein the solder resist comprises an inner portion and an outer portion divided by the perimeter groove, and the at least one extension groove is formed in the outer portion.

14. The method of claim 8, wherein the encapsulant is an epoxy resin.

15. The method of claim 8, wherein the forming of the extension groove further comprises:
   forming a first extension groove in-between portions of the circuit lines; and
   forming a second extension groove, having a portion thereof positioned over at least a portion of the circuit lines, over the first extension groove.

16. A package board comprising:
   a board having circuit lines; and
   solder resist formed on a surface of the board;
   wherein the solder resist comprises a perimeter groove and an extension groove, the perimeter groove exposing at least a portion of the circuit lines, and the extension groove connected to the perimeter groove,
   and wherein encapsulant is filled in the perimeter groove and the extension groove.

17. The package board of claim 16, wherein the extension groove has a predetermined injection angle with respect to an injection direction of the encapsulant.

18. The package board of claim 16, wherein the solder resist comprises an inner portion and an outer portion divided by the perimeter groove, and the extension groove is formed in the inner portion.

19. The package board of claim 16, wherein the solder resist comprises an inner portion and an outer portion divided by the perimeter groove, and the extension groove is formed in the outer portion.

20. The package board of claim 16, wherein the extension groove comprises a first extension groove and a second extension groove, the first extension groove formed in-between portions of the circuit lines, and the second extension groove formed over the first extension groove and having a portion thereof positioned over at least a portion of the circuit lines.

21. The package board of claim 16, wherein at least a portion of the circuit lines is attached to at least one bump of a chip by means of solder.

22. The package board of claim 16, wherein the encapsulant is an epoxy resin.

* * * * *

UNITED STATES PATENT AND TRADEMARK OFFICE
CERTIFICATE OF CORRECTION

PATENT NO. : 7,592,708 B2  Page 1 of 1
APPLICATION NO. : 11/528324
DATED : September 22, 2009
INVENTOR(S) : Seung-Gu Kim et al.

It is certified that error appears in the above-identified patent and that said Letters Patent is hereby corrected as shown below:

Title Page, Item (75) Column 1 (Inventors), Line 1, change "Chungcheonbuk-do" to --Chungcheongbuk-do--.

Signed and Sealed this

Twenty-ninth Day of December, 2009

David J. Kappos
*Director of the United States Patent and Trademark Office*